(12) United States Patent
Melzner

(10) Patent No.: US 7,962,878 B2
(45) Date of Patent: Jun. 14, 2011

(54) METHOD OF MAKING AN INTEGRATED CIRCUIT USING PRE-DEFINED INTERCONNECT WIRING

(75) Inventor: Hanno Melzner, Sauerlach (DE)

(73) Assignee: Infineon Technologies AG, Neubiberg (DE)

( * ) Notice: Subject to any disclaimer, the term of this patent is extended or adjusted under 35 U.S.C. 154(b) by 585 days.

(21) Appl. No.: 12/037,526

(22) Filed: Feb. 26, 2008

(65) Prior Publication Data
US 2009/0217228 A1   Aug. 27, 2009

(51) Int. Cl.
G06F 17/50 (2006.01)
(52) U.S. Cl. ......... 716/122; 716/126; 716/129; 716/130
(58) Field of Classification Search ................ 716/8–14, 716/122, 126, 129, 130
See application file for complete search history.

(56) References Cited

U.S. PATENT DOCUMENTS

| | | | |
|---|---|---|---|
| 4,916,514 A | 4/1990 | Nowak | |
| 5,557,533 A | 9/1996 | Koford et al. | |
| 5,861,342 A | 1/1999 | Gabriel et al. | |
| 5,914,887 A | 6/1999 | Scepanovic et al. | |
| 6,052,677 A | 4/2000 | Masuoka et al. | |
| 6,360,191 B1 | 3/2002 | Koza et al. | |
| 6,363,519 B1 | 3/2002 | Levi et al. | |
| 6,913,990 B2 | 7/2005 | Nuetzel | |
| 7,152,215 B2 | 12/2006 | Smith et al. | |
| 7,260,209 B2 | 8/2007 | Harvey | |
| 7,356,781 B2 | 4/2008 | Koeder et al. | |
| 2001/0047507 A1 | 11/2001 | Pileggi et al. | |
| 2001/0049815 A1* | 12/2001 | Shinomiya et al. | ............. 716/11 |
| 2002/0063569 A1* | 5/2002 | Kanamoto | .................... 324/765 |
| 2005/0262466 A1 | 11/2005 | Koeder et al. | |
| 2006/0190893 A1 | 8/2006 | Morton | |
| 2006/0246719 A1 | 11/2006 | Rueger et al. | |
| 2007/0277137 A1* | 11/2007 | Savithri et al. | .................. 716/10 |
| 2008/0010934 A1 | 1/2008 | Rizzo et al. | |

OTHER PUBLICATIONS

Xyalis, GTsmooth, website: www.xyalis.com/gtsmooth.htm, printed on Mar. 29, 2007, pp. 1-6, Copyright 2006 Xyalis, Developed by iMediasoft.
The Mosis Service, Mosis CMP and Antenna Rules, website: http://www.mosis.org/Technical/Designrules/ guidelines.html, printed on Mar. 29, 2007, pp. 1-4.
Dr. Artur Balasinski, Cypress Semiconductor and Dr. Sam Nakagawa, Blaze DFM; Using fill synthesis for enhanced planarization (part 2), website: http://www.edadesignline.com/howto/showArticleihtmlisessionid=41CO3XIXLVX3UOS, printed on Mar. 29, 2007, pp. 1-3, Copyright 2006 CMP Media LLC.
Dr. Artur Balasinski, Cypress Semiconductor and Dr. Sam Nakagawa, Blaze DFM; Using fill synthesis for enhanced planarization (part 2), website: http://www.edadesignline.com/howto196600473, printed on Mar. 29, 2007, pp. 1-9, Copyright 2006 CMP Media LLC.

* cited by examiner

*Primary Examiner* — Vuthe Siek
(74) *Attorney, Agent, or Firm* — Dicke, Billig & Czaja, PLLC

(57) ABSTRACT

A method for configuring an integrated circuit including configuring a plurality cells to form a cell library, wherein configuring each cell includes defining intracell wiring in at least one layer positioned above a substrate, the intracell wiring connecting to structures below the at least one layer and forming one or more terminals, and defining one or more candidate wires for at least one terminal to use as pre-defined intercell wiring for connection to the at least one terminal. The method further includes arranging selected cells from the cell library to form a desired layout of an integrated circuit, and routing intercell wiring so as to interconnect the selected cells to achieve a desired function of the integrated circuit including using only selected candidate wires for intercell wiring within borders of each of the selected cells.

25 Claims, 9 Drawing Sheets

METHOD OF MAKING AN INTEGRATED CIRCUIT USING PRE-DEFINED INTERCONNECT WIRING

BACKGROUND

An integrated circuit (IC) logic cell typically consists of a pre-designed layout of transistors or non-specific collection of logic gates which are configured according to a set of rules such as Design Rules (e.g. minimum wire widths, minimum spacing between structures, etc.), timing rules, and antenna rules, among others. A plurality of such pre-designed or standard IC cells, each having a unique configuration and/or logical function, is referred to as a cell library. To form an IC, such as an application specific IC (ASIC), standard cells are selected from the cell library and arranged in a desired layout. The terminals of the arranged cells are then connected to each other and to external terminals by metal wires or traces to achieve the desired logical function of the IC. This is often referred to as the "place and route" step of IC design.

The "place and route" step is typically performed by automated "place and route tools" or "routers". Unfortunately, the wires created by routers are not always ideal for manufacturing and yield. For example, even when thicker wires could be used, routers often employ minimum width wires which are more sensitive to defect induced interruptions ("opens") than thicker wires. Also, routers also often place wires at minimum separation distances even when larger distances, which are less sensitive to defect induced bridges ("shorts"), could be employed. Additionally, because routers typically assign wires to routing tracks which are at a regular pitch, multiple jogs are often created in wires when connecting wire to pin shapes.

Furthermore, interaction between the wires and structures of the standard cell and those added by the router sometimes create complicated shapes, referred to as "ugly shapes", which are often, but not exclusively, near wire ends where the wire connects to via holes that vertically connect layers of the IC. These ugly shapes can introduce several problems. First, they increase data volume (i.e. file size) and runtimes of subsequent algorithms, such as those employed for optical proximity correction (OPC). They can also confuse such downstream algorithms or cause them to be more complicated and error-prone. For example, when optimizing a wire end, an OPC algorithm must detect first the wire end and then make appropriate modifications. Both stops are more complicated if wire ends come in many and unpredictable variants.

Ugly shapes also create multiple variants of a structure within a cell. Because different variants of a structure have different "acceptance regions" (i.e. the manufacturing parameter space within which a structure is successfully fabricated), the "total acceptance region" (i.e. the intersection of all individual acceptance regions) will shrink. The main manufacturing parameters of the lithography processes used to form the ICs are exposure dose, focus, and misalignment. Ugly shapes which reduce or limit the acceptance region of the lithography parameters are called "litho hot spots" and can reduce the reliability of the IC (by increasing the sensitivity to opens and shorts) and reduce manufacturing yield.

Several techniques have been employed to address the above described router shortcomings. One technique employs an algorithm which widens wires identified as being unnecessarily narrow (i.e. wires which are at a minimum width when more space is available) and increases spacing between wires which are unnecessarily close to one another (i.e. at minimum spacing when more space is available).

Another commonly employed technique is to perform a lithography simulation to predict the actual shape of the wires and structures formed in a wafer in which the IC is created by optical imaging processes. Any shapes identified as being problematic (i.e. litho hot spots) are automatically modified in hopes of eliminating the litho hot spot.

While the above described techniques have achieved a certain degree of success in higher metal layers, they are not effective in lower metal layers, such as metal-1 layers, as wire shapes are often complicated and densely packed such that the fixing of one problem often creates another.

SUMMARY

In one embodiment, a method is provided for configuring an integrated circuit. The method includes configuring a plurality cells to form a cell library, wherein configuring each cell includes defining intracell wiring in at least one layer positioned above a substrate, the intracell wiring connecting to structures below the at least one layer and forming one or more terminals, and defining one or more candidate wires for at least one terminal to use as pre-defined intercell wiring for connection to at least one terminal. The method further includes arranging selected cells from the cell library to form a desired layout of an integrated circuit, and routing intercell wiring so as to interconnect the selected cells to achieve a desired function of the integrated circuit including using only selected candidate wires for intercell wiring within borders of each of the selected cells.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

In one embodiment, a method of pre-defining interconnect wiring in logic cells is described which improves the wire layouts of integrated circuits produced by automated routing processes by reducing the occurrence of litho hot spots, for example, and thereby improving the manufacturability and reliability of the integrated circuit.

Figure 1:
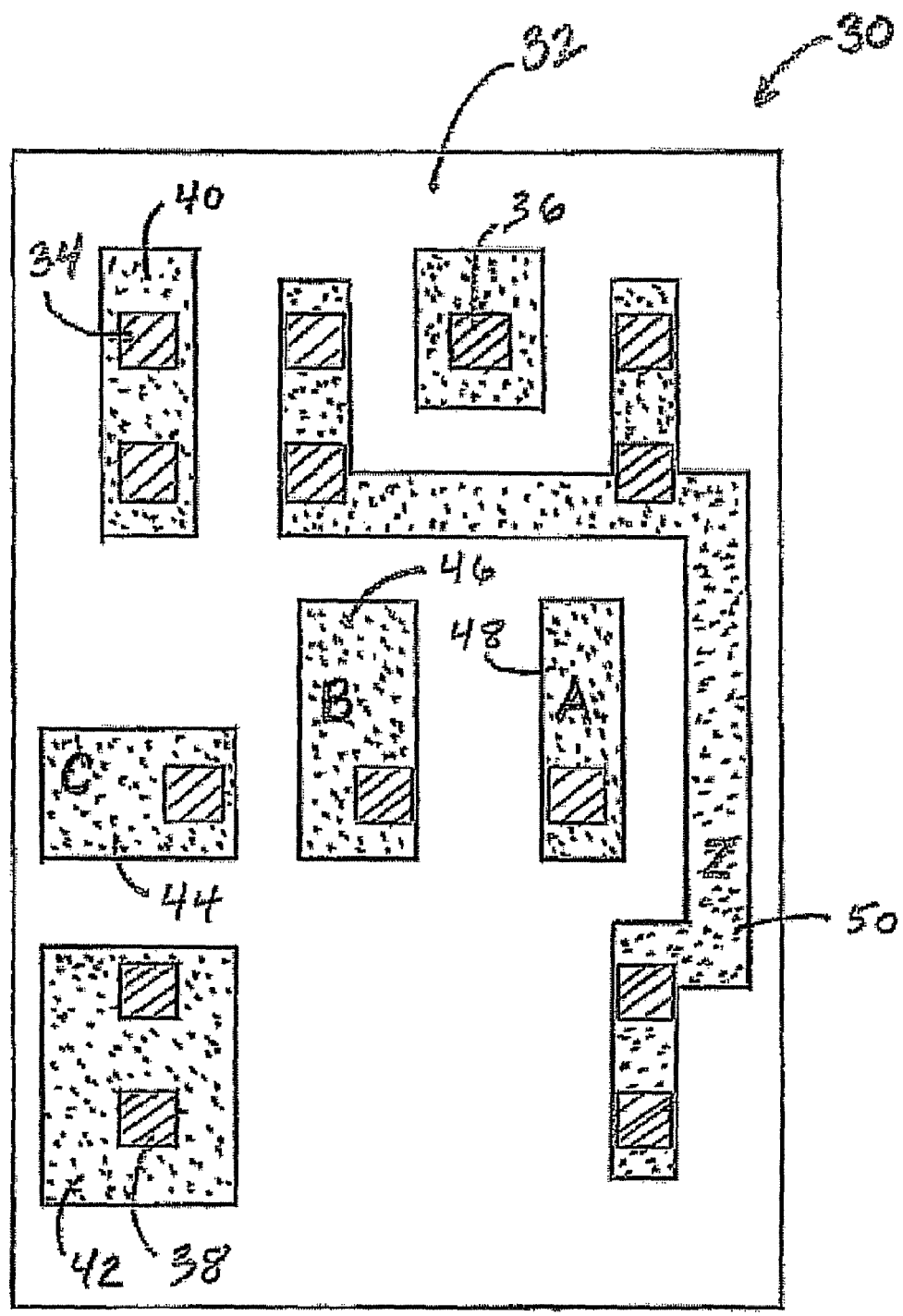
FIG. 1 is a schematic diagram illustrating a physical layout of an example semiconductor cell.

FIG. 1 is a schematic diagram of one embodiment of a cell 30 and generally illustrates an example wiring layout in a first metal (M1) layer 32. The square "hatched" elements, such as elements 34, 36, and 38, illustrate vias, more specifically "down" vias, which vertically connect M1 layer 32 to structures below M1 layer 32, such as source, gate, and drain structures of transistors formed in the substrate, for example. For ease of illustration and clarity, the transistors are not shown herein. The "filled" elements, such as elements 40 and 42, represent metal segments or wires in M1 layer 32 which couple the vias (e.g. vias 34, 36, and 38) to one another, thereby connecting the active areas of the transistors below M1 layer 32, for example, and form terminals, such as terminals A, B, C, and Z, respectively illustrated at 44, 46, 48, and 50.

A plurality of cells, such as cell 30, each cell having a unique configuration or layout and/or logical function, is referred to as a cell library. The number of cells contained in a given library varies, but is often between 300 and 1,000 cells. To form an IC, such as an application specific IC (ASIC), cells are selected from the cell library and arranged in a desired layout or footprint and interconnected or wired to one another and to external PINS so as to achieve a desired operation.

The metal segments illustrated in FIG. 1, such as metal segments 40 and 42, and terminals 42, 44, and 46, along with the "down" vias, such as down vias 34, 36, and 38, represent standard or "intracell" wiring within cell 30. The standard or intracell wiring and terminals are carefully arranged, often by hand, so as to be in accordance with a set of design rules. Design rules are typically specific to a particular semiconductor manufacturing process, but usually specify certain geometries and connectivity restrictions (e.g. minimum wire widths, minimum spacing between structures, timing rules, antenna rules, etc.) which provide sufficient safety margins to account for variability in manufacturing process so as to better ensure proper operation of the IC after fabrication.

When forming an IC, the layout of the selected cells and the routing of the interconnect or "intercell" wiring is typically performed by an automated computer aided design (CAD) placement and routing tool or "router". While routers also follow design rules when routing interconnect wiring, as described earlier, routers often place wires at minimum separation distances and with minimum wire widths even when greater separation distances and widths could be employed, and often create so-called ugly shapes, all of which can reduce manufacturing yields and operational reliability of the IC.

According to embodiments described in greater detail below, in order to reduce the occurrence of such router-introduced shortcomings (e.g. ugly shapes, unnecessarily thin wires, etc.), optional candidate intercell wiring (e.g. up-vias, wires) for "outside" connection to terminals in the M1 layer of a cell are pre-defined and included as part of cell during initial layout of the cell. During a subsequent layout and routing process in the formation of an IC, the router is only able to select from and employ the predefined candidate wiring for connection to cell terminals as required, and is not able to place and route its own vias and metal shapes and wires in the M1 layer within the cell boundaries.

The optional candidate vias and metals shapes and wires which are selected for use by the router are then realized in the IC layout. According to one embodiment, those candidate vias which are not selected or employed by the router are "deleted" (i.e. not included or realized in the IC layout). According to one embodiment, as will be described in greater detail below, portions of non-selected metal segment candidates are employed in the IC layout as fill structures.

When interconnecting the cells of an IC, there are three common types of connections from intercell wiring placed by the automated router to cell terminals (e.g. A, B, C, and Z1). These three types of connections are referred to herein as "via-on-cell" connections, "border terminal" connections, and "inner terminal" connections. Intercell wiring is often vertically connected to the M1 layer terminals from upper layers by via holes. Often, the standard metal segments of the cell terminals are of sufficient size so that the router is able to place a via hole on the metal shape without requiring modifications to the metal segment. In other cases, the router must add small metal extensions to the cell terminals in order to property place via holes and provide desired via metal overhang. These are examples of the so-called via-on-cell connections.

In some instances, the cell terminals are located proximate to one of typically four borders of a cell border. If there is a "filler" cell (i.e. a cell which is mainly empty of structures) abutting the cell border to which the terminal is proximate, a via can be placed in the filler cell and an interconnect wire can be routed to the border terminal through the filler cell without intruding into inner regions of the cell. A border terminal of a neighboring cell abutting the cell border may also be connected to the border terminal when necessary without intruding into inner regions of the cell if the border terminals align with one another. These are examples of the so-called border terminals connections.

In other cases, cell terminals are located at inner regions of the cell (i.e. away from cell borders), but there is sufficient room to make a connection to the terminal by routing a wire from a cell border to the terminal. These are the so-called inner terminal connections. Although connections are not made to cell terminals, routers sometimes route wires through "empty" space within a cell for connection to terminals of another cell. Such wires are referred to as "feedthrus".

Figure 2:
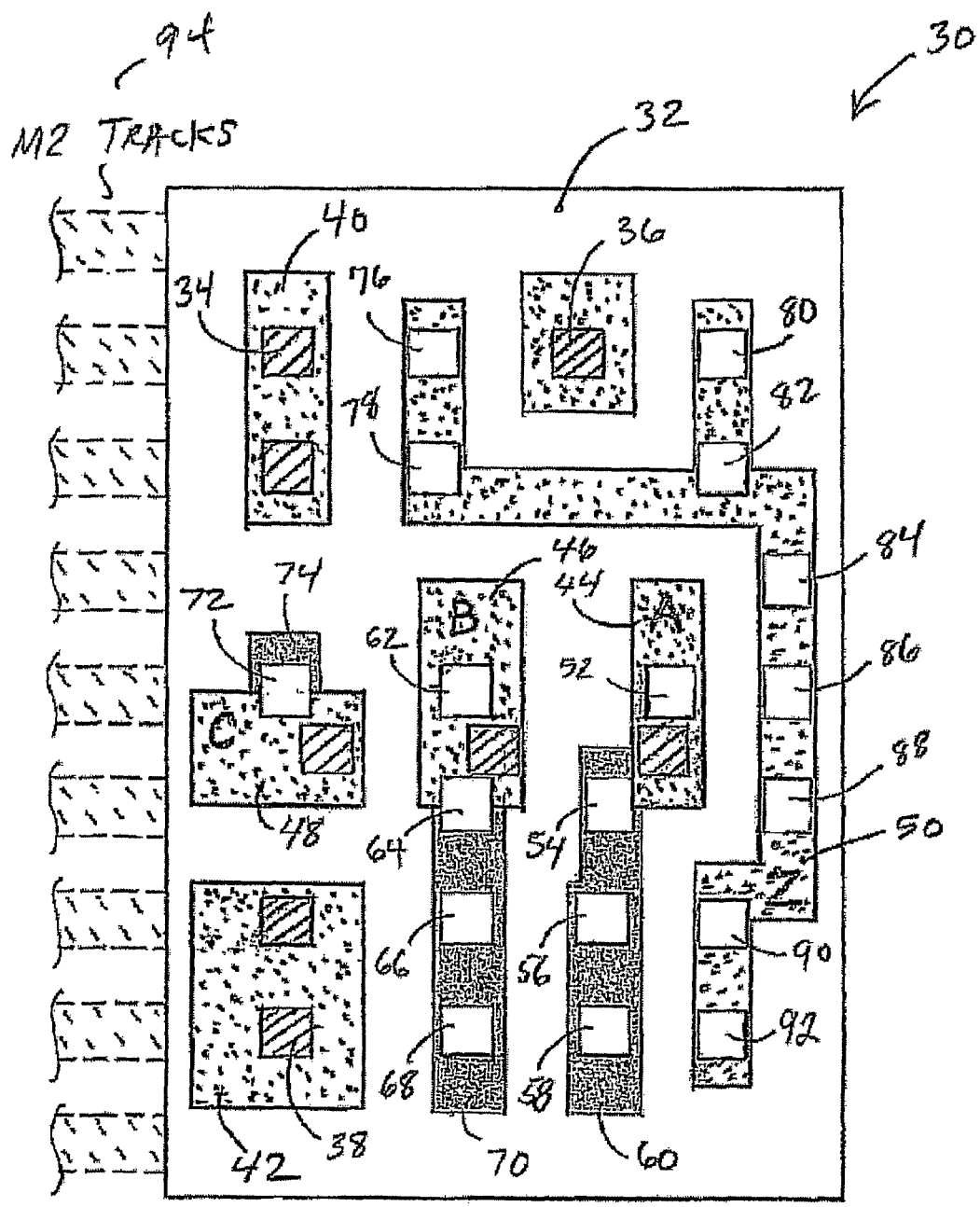
FIG. 2 is a schematic diagram of the semiconductor cell of FIG. 1 including candidate vias according to one embodiment.
Figure 2:
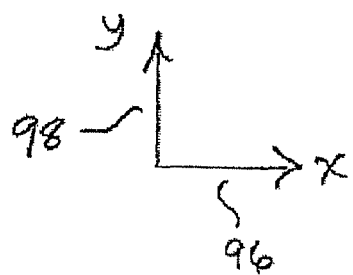

FIGS. 2 through 8 below illustrate example embodiments of predefined optional candidate vias, metal shapes, and wires for selection by a router when connecting the terminals of M1 layer 32 of cell 30 of FIG. 1. FIG. 2 illustrates one embodiment of optional candidate vias and associated metal segments from which an automated router can choose for making vertical via-on-cell type connections to terminals A 44, B 46, C 48, and Z 50 of M1 layer 32 from upper metal layers, such as a second metal (M2) layers. In FIG. 2, "white" squares indicate pre-defined candidate "up-vias" to upper metal layers and "shaded" elements indicate metal segments added to properly connect up-vias to corresponding terminals.

Pre-defined candidate up-vias 52, 54, 56, and 58 provide optional vertical connection paths to terminal A 44. Note that candidate up-via 52 is placed directly on terminal A 44, while a metal segment 60 provides an extension from terminal A 44 to connect candidate up-vias 54, 56, and 58 to terminal A 44, including providing desired "metal overhang" about candidate up-vias 54, 56, and 58.

Pre-defined candidate up-vias 62, 64, 66, and 68 provide optional vertical connection paths to terminal B 46. Note that candidate up-via 62 is placed directly on terminal B 46, while a metal segment 70 provides an extension from terminal B 46 to connect candidate up-vias 62, 64, 66, and 68 to terminal B 46, including providing desired "metal overhang" about candidate up-vias 64, 66, and 68. With regard to terminal C 46, pre-defined candidate up-via 72 provides a vertical connection path through associated metal segment 74. Candidate vias 76, 78, 80, 82, 84, 86, 88, 90, and 92 are placed on and provide optional vertical connection paths to terminal Z 50.

In one embodiment, the routing of wires in the M2 layer is permitted only along a predefined track grid, as illustrated at 94, with the M2 layer routing tracks being illustrated by the dashed/hatched elements. In one embodiment, as illustrated by FIG. 2, M2 layer routing tracks 94 are equally spaced from one another and run in a horizontal direction relative to M1 layer 32. According to one embodiment, as is also illustrated by FIG. 2, the optional candidate vias are vertically positioned so as to align with M2 layer routing tracks 94. It is noted that within a given layer, the term "horizontal" refers to a direction along x-axis 96 and the term "vertical" to a direction along y-axis 98.

During a routing process when forming an IC of which cell 30 is to be a part, if the automated router chooses to make a via-on-cell connection to any of the terminals A 44, B 46, C 48, and Z 50, the router must choose from the optional candidate up-vias illustrated in FIG. 2. The router cannot, on its own, automatically create other vias or associated metal within cell 30. Often, according to design rules, it is considered "good practice" to employ a pair of up-vias when connecting to terminals, such as terminals A 44, B 46, C 48, and Z 50 of M1 layer 32. It is noted that in the example of FIG. 2, there is only one optional candidate via 74 for terminal C 48, as space limitations did not allow a second candidate via without violating minimum spacing requirements from metal segment 40.

As such, if the router chooses to make a via-on-cell connection to terminal C 48, the router must employ candidate up-via 72, along with associated metal segment 74. However, if making a via-on-cell connection to terminals A 44, B 46, and Z 50, the router is able choose or select two up-vias from four candidate up-vias for both terminals A 44 and B 46, and from nine candidate up-vias from terminal Z 50. The selected candidate up-vias and required portions of associated metal extensions are then employed or realized in the IC layout. Those candidate vias and portions of associated metal extensions which are not selected or employed by the router are "deleted" (i.e. not included or realized in the IC layout).

Figure 3:
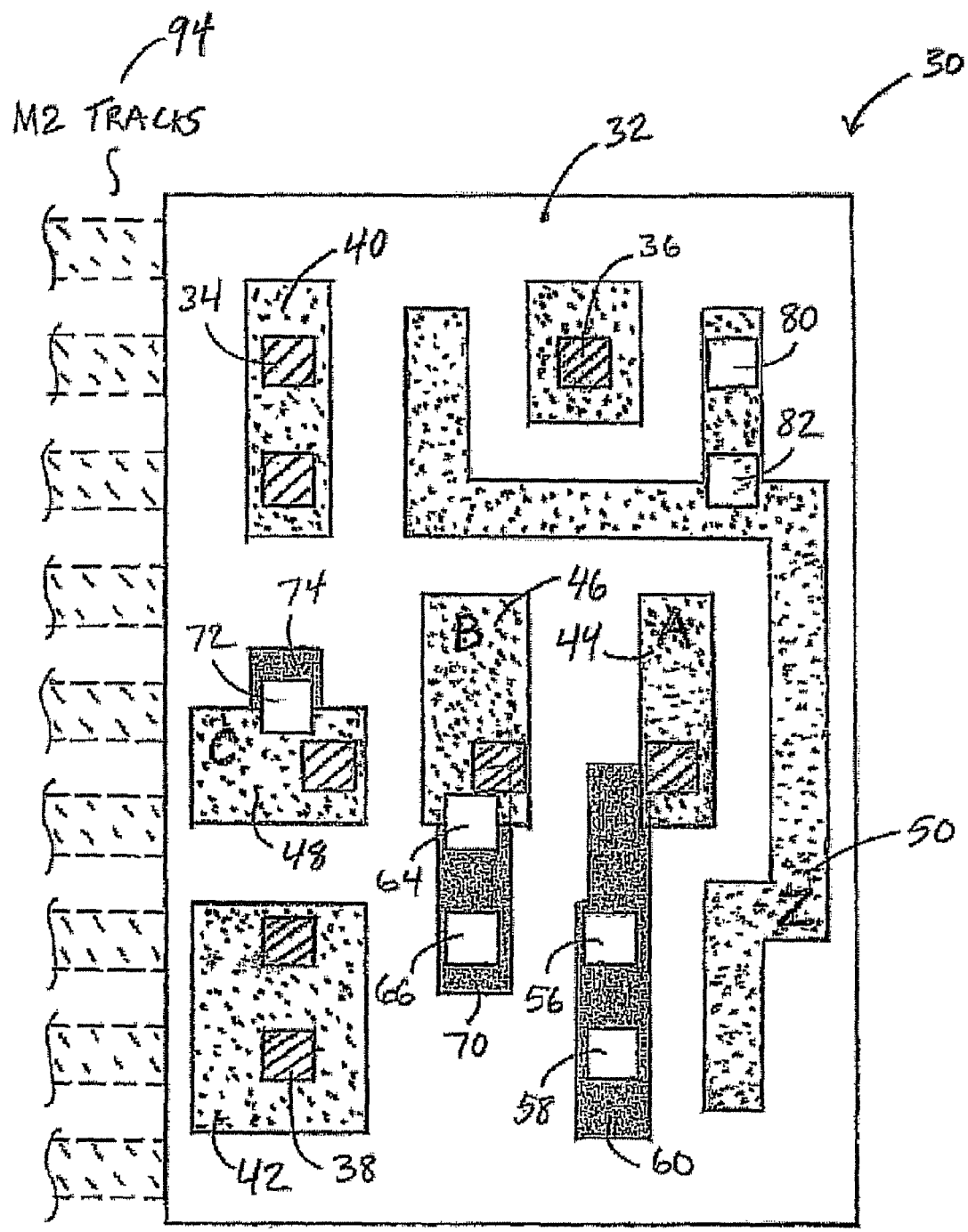
FIG. 3 is a schematic diagram of the semiconductor cell of FIG. 2 including selected candidate vias according to one embodiment.

FIG. 3 is illustrates one embodiment of a layout of M1 layer 32 of cell 30 resulting from a router selecting from the candidate up-vias illustrated by FIG. 2 to make via-on-cell connections to terminals A 44, B 46, C 48, and Z 50. As illustrated, the router selected candidate up-vias 56 and 58 for connection to terminal A 44 and deleted candidate up-vias 52 and 54, thereby requiring the full extent of associated metal extension 60. Candidate up-vias 64 and 66 were selected for connection to terminal B 46, with candidate up-vias 62 and 68 being deleted along with a portion of metal extension 70 associated with and required for deleted up-via 68. Candidate up-via 80 and 82 were selected for connection to terminal Z 50, with candidate up-vias 76, 78, 84, 86, 88, 90, and 92 being deleted. Sole candidate up-via 72, and associated metal extension 72, was selected for connection to terminal C 48.

Figure 4:
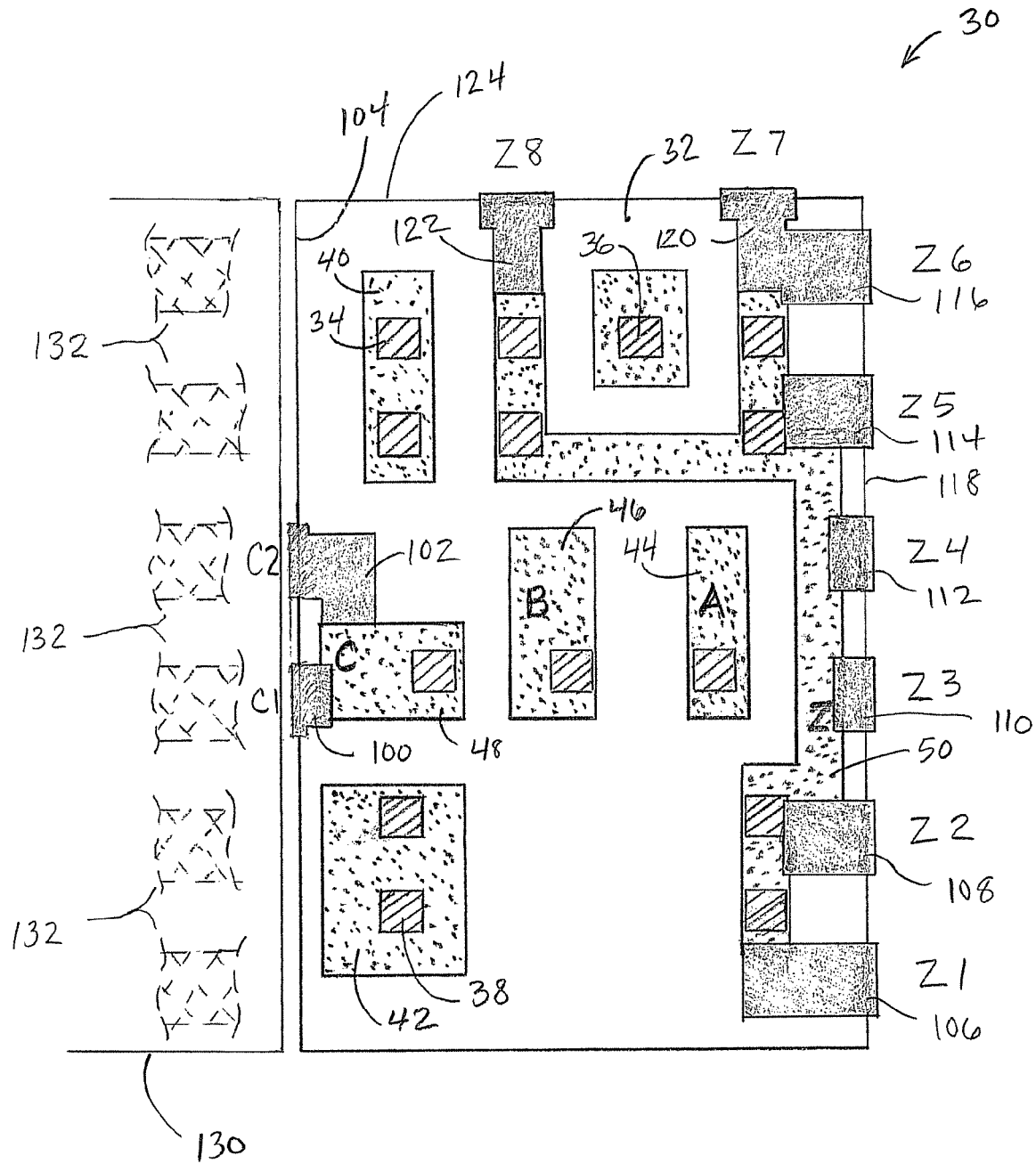
FIG. 4 is a schematic diagram of the semiconductor cell of FIG. 2 including candidate border terminal wires according to one embodiment.

FIG. 4 illustrates one embodiment of candidate border terminal wire segments from which an automated router can choose for making "border terminal" connections to border terminals C 48 and Z 50. It is noted that terminals A 44 and B 46 are positioned away from borders of cell 30 and are not defined or referred to herein as border terminals. In FIG. 4, the "shaded" elements indicate pre-defined candidate border terminal metal segments or wires which are includes as part of the standard wiring of cell 30 and from which an automated router can choose for making border terminal connections to border terminals C 48 and Z 50 of layer M1 32.

Candidate border terminal segments or wires 100 and 102 provide optional connection points to terminal C 48 from a horizontal border 104 of cell 30. Note that candidate border terminal wire 100 is illustrated as border connection point "C1" and candidate border terminal wire 102 is illustrated as border connection "C2".

Pre-defined candidate border terminal segments or wires 106, 108, 110, 112, 114, and 116 provide optional border connection points to terminal Z 50 from a horizontal border 118 of cell 30, and are respectively illustrated as border connection points Z1 through Z6. Similarly, pre-defined border terminal candidate wires 120 and 122 provide optional border connection points to terminal Z 50 from a vertical border 124 of cell 30, and are respectively illustrated as border connection points Z7 and Z8.

Similar to that described above by FIGS. 2 and 3 with respect to via-on-cell connections, if the automated router chooses to make border terminal connections to terminals C 48 and Z 50 during formation of an IC of which cell 30 is to be a part, the router must choose from the candidate border terminal wires illustrated in FIG. 4. As such, if making a border terminal connection to terminal C4, the router must select from border connection points C1 and C2. If making a border terminal connection to terminal Z 50, the router must select from border connection points Z1 through Z5 along horizontal border 118 and border connections Z7 and Z8 along vertical border 124. The router cannot automatically create its own border connections to terminals C 48 and Z50. Also, similar to that described above with respect to via-on-cell candidate vias, the selected candidate border terminal wires are included as part of the IC layout and non-selected candidate border terminal wires are deleted.

In one embodiment, as illustrated by FIG. 4, the border connection points along the horizontal borders of a cell, such as border connection points C1 and C2 along horizontal cell border 104 and border connection points Z1 through Z6 along horizontal cell border 118, are arranged on a pre-defined grid. In one embodiment, the grid is a "relaxed" grid relative to the design rules applied to the intracell wiring. In one embodiment, the grid is at 1.5 times (1.5×) the design rules. For example, if the design rules call for wires to be 100 nanometers wide and be separated by 100 nanometers, wires would centered at a minimum pitch of 200 nanometers. With a 1.5 relaxed design rule, the wires would 150 nanometers wide and be centered at a pitch of 300 nanometers. In one embodiment, the grid is based on a 1.2 relaxed design rule.

In one embodiment, as illustrated by FIG. 4, at least the ends of the candidate border terminal wires proximate to the cell borders have a width based on a desired relaxed design rule, such as illustrated by the ends of pre-defined candidate border terminal wires 100 and 102 proximate to horizontal cell border 104. In one embodiment, the width of an entire length of the pre-defined candidate border terminal wire is based on a desired relaxed design rule, such as illustrated by pre-defined candidate border terminal wires 16 and 108 connecting terminal Z 50 to horizontal cell border 118.

In one embodiment, as illustrated by FIG. 4, the relaxed design grid is imposed upon or employed by the router for placement or routing of wires in so-called filler cells. A portion of a filler cell is illustrated at 130 in FIG. 4, with a predefined relaxed wiring grid being illustrated by the dashed and cross-hatched elements 132. Aligning border connection points on a grid in this fashion enables neighboring cells to be connected to one another more conveniently when required. Also, by applying a relaxed grid or design rule, the shortcomings introduced by the routing or placement of wires in filler cells (e.g. minimum wire widths, minimum spacing between structures, ugly shapes) is reduced.

In one embodiment, the border connection points along the vertical borders of a cell, such as border connection points Z7 and Z8 along vertical cell border 124, are also arranged on a pre-defined grid. Again, this enables terminals of neighboring cells to be more readily connected if required. In one embodiment, for example, the grid has a pitch of 180 nanometers. However, arranging the vertical border connection points on a pre-defined grid requires the cell have a width which is an integer value of the grid pitch, meaning that some cells may be wider than would otherwise be necessary so that cell area may increase.

Figure 5:
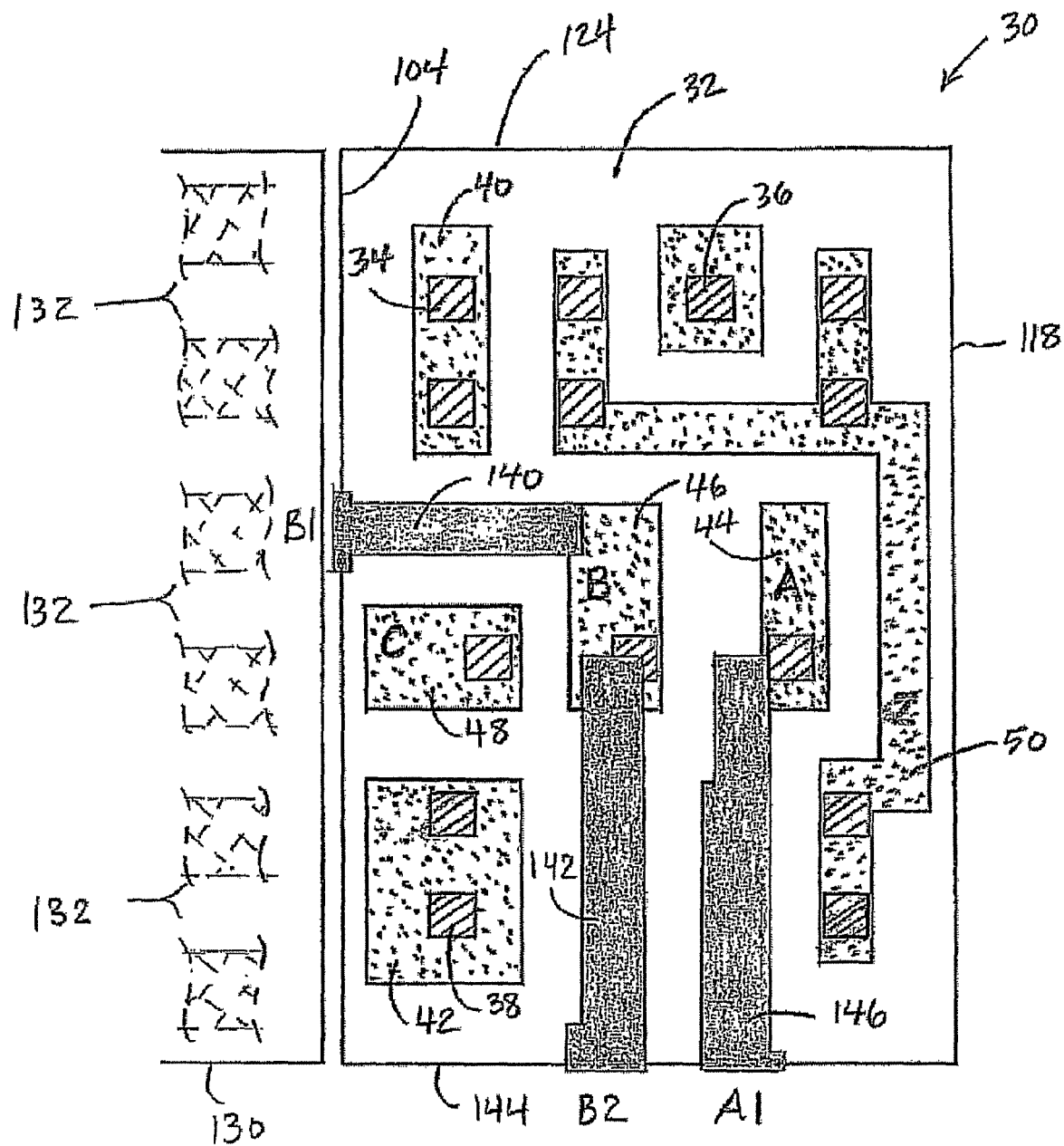
FIG. 5 is a schematic diagram of the semiconductor cell of FIG. 1 including candidate inner terminal wires according to another embodiment.

FIG. 5 illustrates one embodiment of pre-defined candidate inner terminal wires from which an automated router can select for making "inner terminal" connections to inner terminals A 44 and B 46. It is noted that terminals A 44 and B 46 are positioned away from borders of cell 30 and are referred to as "inner" terminals relative to "border" terminals C 48 and Z 50, which are positioned proximate to horizontal cell borders 104 and 118. In FIG. 5, the "shaded" elements indicate pre-defined candidate inner terminal wires added to standard wiring of cell 30 from which an automated router can choose for making connections to inner terminals A 44 and B 46 of layer M1 32 from border connection points.

Candidate inner terminal wires 140 and 142 respectively provide optional connection points to terminal B 46 from horizontal border 104 of cell 30 and from a vertical border 144. Note that candidate inner terminal wire 140 is illustrated as border connection point "B1" and candidate inner terminal wire 142 is illustrated as border connection point "B2". Similarly, pre-defined candidate inner terminal wire 146 provides an optional connection point to terminal A 44 from vertical border 144, illustrated as border connection point "A1".

Similar to that described above by FIGS. 2 and 3 with respect to via-on-cell connections, if the automated router chooses to make inner terminal connections to terminals A 44 and B 46 during formation of an IC of which cell 30 is to be a part, the router must choose from the candidate inner terminal wires illustrated in FIG. 4. As such, if making an inner terminal connection to terminal B 48, the router must select from border connection points B1 and B2. If making an inner terminal connection to terminal A 44, the router can select only border connection point A1. The router cannot automatically create its own border connections to inner terminals A 44 and B 46. Again, similar to that described above with respect to via-on-cell candidate vias, the selected candidate inner terminal wires are included as part of the IC layout and non-selected candidate inner terminal wires are deleted.

In one embodiment, the predefined candidate inner terminal wires are laid out on the border grid described above by FIG. 4 with respect to candidate border terminal wires.

Figure 6:
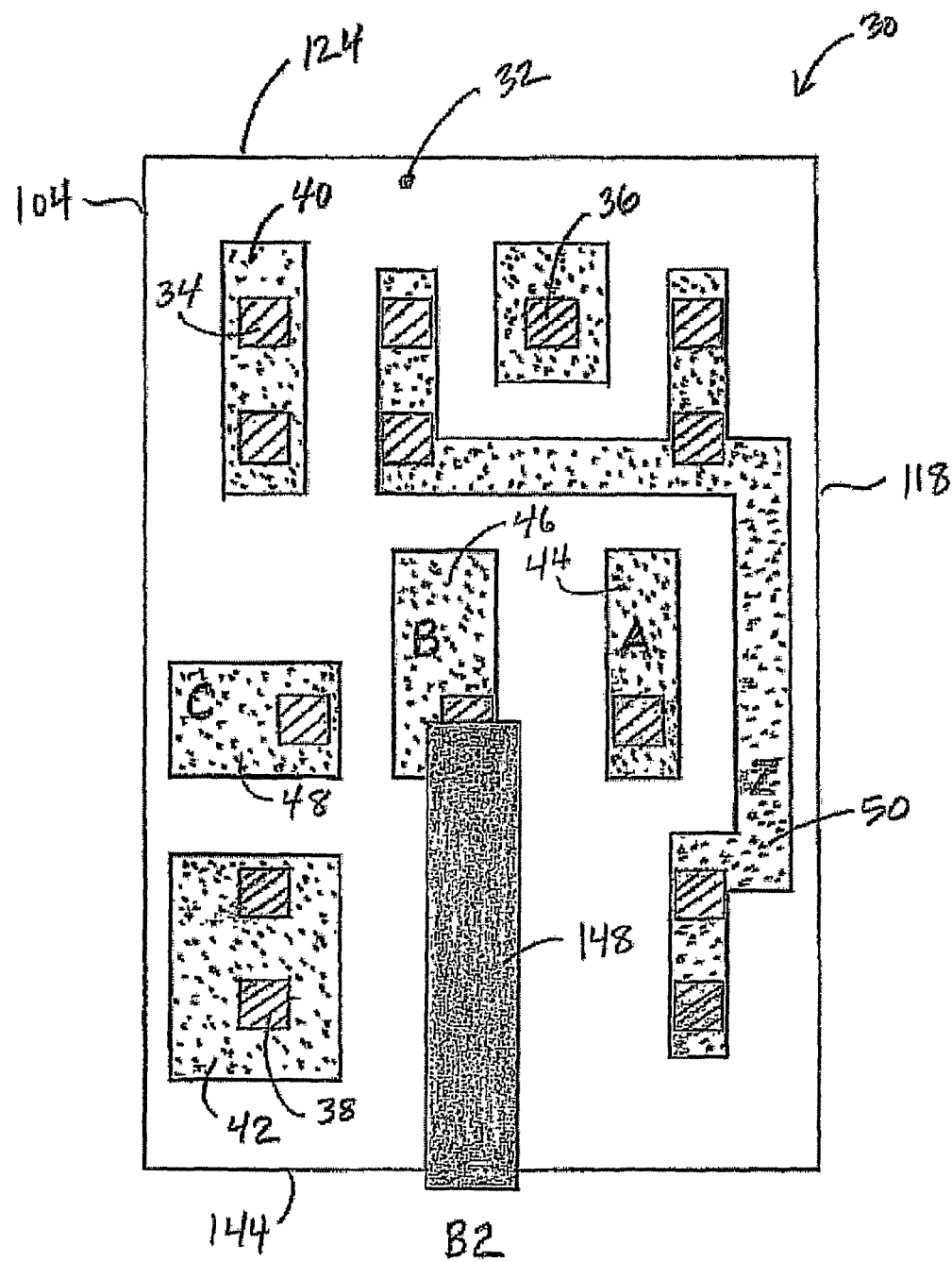
FIG. 6 is a schematic diagram of the semiconductor cell of FIG. 1 including candidate inner terminal wires according to one embodiment.

FIG. 6 illustrates an example of an additional candidate inner terminal wire 148 from which the automated router can select for connecting to inner terminal B 46 from border connection point "B2" along vertical cell border 144. With reference to FIG. 5, it is noted that candidate inner terminal wire 148 is wider than candidate inner terminal wire 142. For example, in one embodiment, an entire length of candidate inner terminal wire 148 has a width based on a desired relaxed design rule (e.g. 1.5×) rather than just an end proximate to cell border 144 as does candidate inner terminal wire 142. Additionally, it is noted that the router may only select candidate inner terminal wire 148 for connection to inner terminal B 46 if candidate inner terminal wire 146 is not selected for connection to inner terminal A 44.

Although not illustrated herein, further options for additional candidate inner terminal wires could be provided for inner terminal B 46, as well as for inner terminal A 44. However, the more options which are made available for the router to select from, the more complicated and more expensive the design of cell 30 becomes, and the more complicated the router becomes and the longer it takes for the router to complete the layout of the interconnect wiring.

Additionally, in one embodiment, although not illustrated herein, candidate "route-thru" wires are also predefined within cells, such as cell 30. If a router chooses to route interconnect wiring through a given cell for connection to another cell, the router must select and employ a predefined candidate route-thru wire, and cannot place its own wiring.

In one embodiment, in order to enable the router to identify between the base or required intracell wiring within a cell (e.g. the wiring of cell 30 illustrated in FIG. 1), the required intracell wiring and each of the various optional candidate wire types for intercell wiring (e.g. candidate vias, candidate border terminal wires, and candidate inner terminal wires) are represented by a different data type. In one embodiment, for example, required intracell wiring is represented by a first data type and optional candidate wire types are represented by a second data type. Additionally, to identify potential conflicts between optional candidate wires, such as the potential conflict between candidate border terminal wire 102 (see FIG. 4) and candidate inner terminal wire 140 (see FIG. 5), the router compares coordinates representative of the positions of optional candidate wires.

Figure 7:
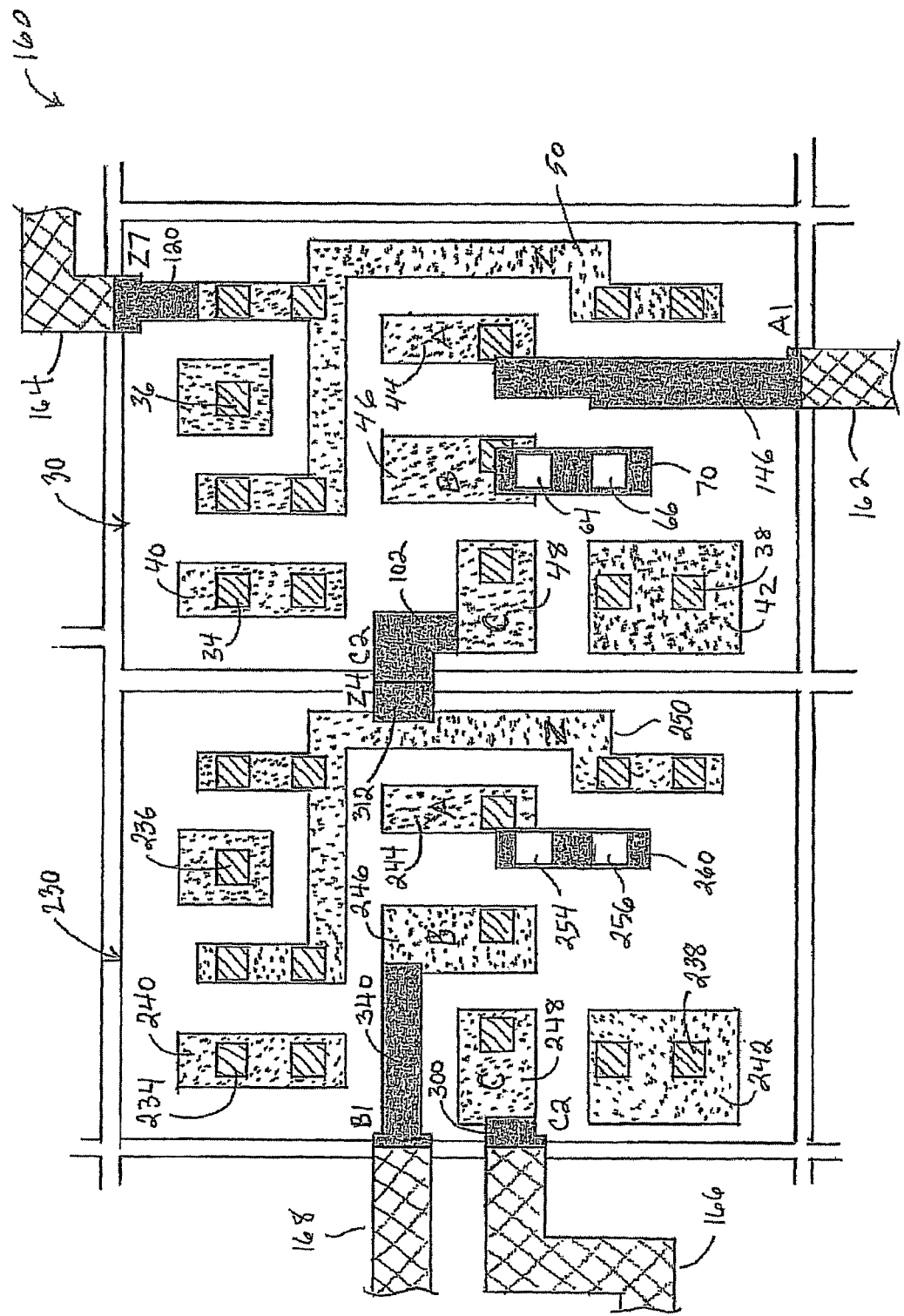
FIG. 7 is a schematic diagram illustrating portions of an integrated circuit including candidate wires according to one embodiment.

FIG. 7 is a diagram showing portions of an IC 160 including cell 30 and a similar cell 230, and illustrating an example of intercell wiring laid out by a router including selecting from candidate vias, candidate border terminal wires, and candidate inner terminal wires, as described above. As illustrated, terminal A 44 is connected to a router placed interconnect wire 162 in a neighboring cell at border connection point A1 using candidate inner terminal wire 146. Terminal B 46 is vertically connected to an upper metal layer using candidate up-vias 64 and 66 and required portions of metal extension 70. Terminal Z 50 is connected to a router placed interconnect wire 164 in a neighboring cell at border connection point Z7 using candidate border terminal wire 120.

Terminal C 48 is connected to a terminal Z 250 of cell 230 by candidate border terminal wire 102, which couples terminal C 48 to border connection point C2, and by a candidate border terminal wire 312 which couples terminal Z 250 to a border connection point Z4. In the example illustration of FIG. 7, it is noted that the border connection points along horizontal borders of cells 30 and 230 (i.e. those cell borders along y-axis 98) are arranged according to a relaxed grid, as described above. By arranging the horizontal border connection points on such a grid, terminal C 48 of cell 30 and terminal Z 312 of neighboring cell 230 are readily connected at aligned border connection points C2 and Z4.

Terminal C 248 of cell 230 is connected to a router placed interconnect wire 166 in a neighboring cell (e.g. a filler cell) at a border connection point C2 using a candidate border terminal wire 300. Similarly, terminal a terminal B 246 of cell 230 is connected to router placed interconnect wire 168 in the neighboring cell at a border connection point B1 using a candidate inner terminal wire 340. Note that router placed interconnect wires 162, 164, 166, and 168 are illustrated based on a desired relaxed design grid.

As illustrated by FIG. 7, by allowing the router to select only from pre-defined optional candidate vias, candidate border terminal wires, and candidate inner terminal wires, which are carefully laid out and included within the cells of the cell library, for interconnect wiring within the boundaries of the cells, and by employing a relaxed design rule (e.g. 1.5×) "outside" the cells (e.g. within filler cells), the occurrence of router-introduced shortcomings (e.g. ugly shapes, unnecessarily thin wires, unnecessary jogs, etc.) during the "place and route" step of IC configuration is reduced. Arranging border connection points in a grid along horizontal and vertical cell borders simplifies connections between bordering cells when required and further reduces jogs in interconnect wiring. The resulting layout avoids the creation of litho hot spots in lower metal layers (e.g. M1 layer) as a matter of design, thus reducing time consuming and costly post-routing detection and correction of such litho hot spots, and reduces the potential for opens and shorts in the resulting IC.

Figure 8:
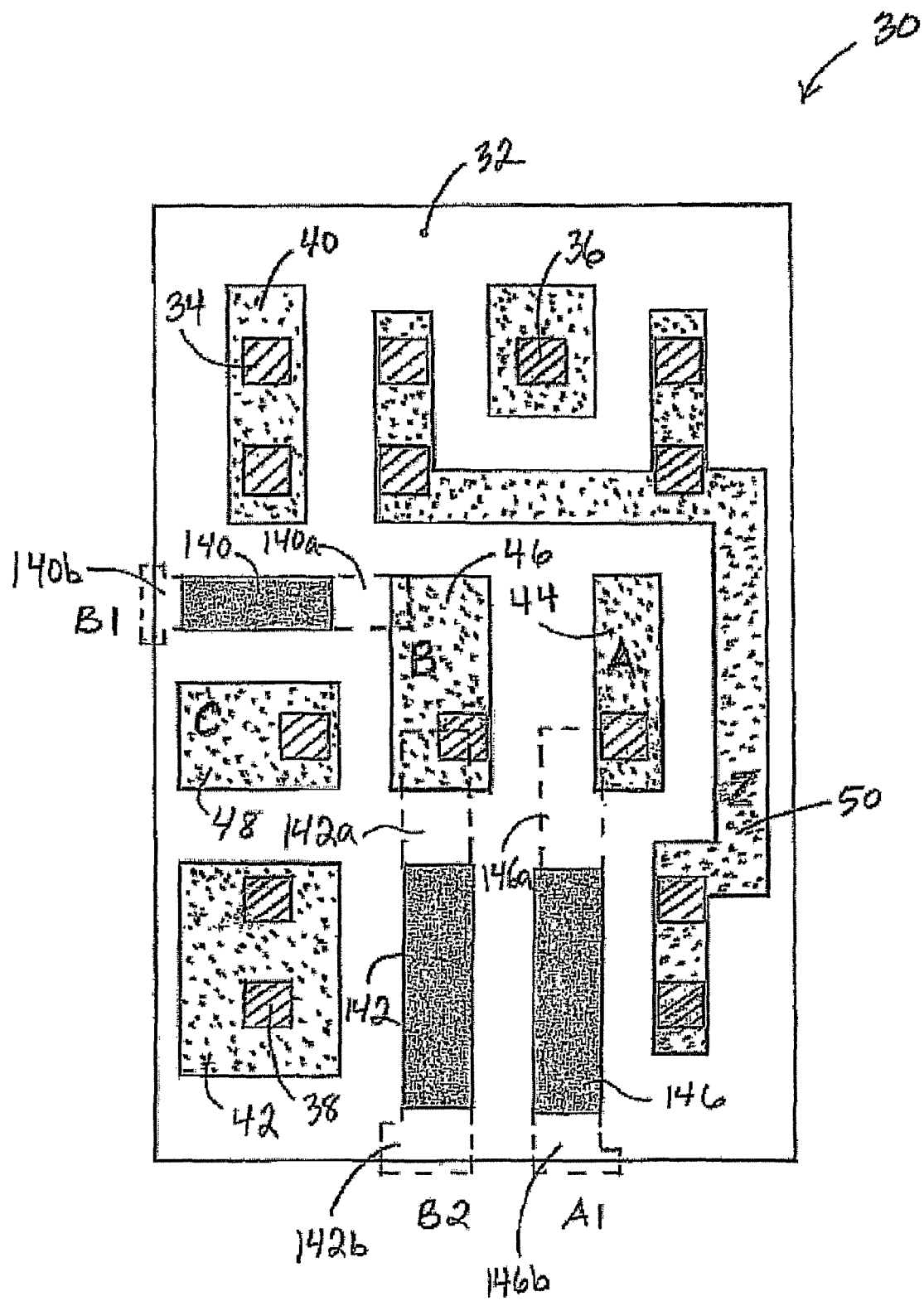
FIG. 8 is a schematic diagram illustrating the semiconductor cell of FIG. 5 including fill structures according to one embodiment.

In one embodiment, as illustrated by FIG. 8, if non-selected candidate inner terminal wires do not conflict with the overall intercell wiring layout configured by the router, rather than deleting the entire non-selected candidate inner terminal wires from the IC layout, only portions of the non-selected candidate inner terminal wires proximate to each end are deleted and a remaining portion is realized in the IC layout as a fill structure. Fill structures are structures that are not necessary for the main electrical operation of a device, such as an IC, but are positioned in spaces between active conductive metal segments or wires that would otherwise be filled only with insulating material so at to prevent "dishing" or "erosion" of such spaces during planarizing of an in-process chip or wafer.

As illustrated by FIG. 8, in one embodiment, only end portions 140a and 140b (illustrated by dashed lines) of candidate inner terminal wire 140 are deleted with a remaining portion, illustrated by the shaded portion, serving as a fill structure in what would otherwise be open space between metal segment 40 and terminals B 46 and C 48. Similarly, only end portions 142a, 142b and end portions 146a, 146b of candidate inner terminal wires 142 and 146 are removed with the remaining portions serving as fill structures in the otherwise open space between metal segment 42 and terminal Z 50.

Including such fill structures in the initial layout of the cells provides several advantages. With regard to lithography simulation, because the fill structures are very similar in shape to the candidate inner terminal wires from which they originate, a separate simulation is not required for the fill structures. With regard to electrical simulation of the cells, including the fill structures in the cell layout enables a more realistic electrical simulation of the electrical parameters of the cell in a "routed" IC environment relative to an electrical simulation of a "naked" cell (i.e. a cell without connections). Additionally, by including the fill structures as part of the initial layout of each cell of the cell library, such as cell 30, time consuming and costly computation of fill shapes to be included in final configuration of the IC after the IC has been routed can be avoided or at least reduced.

Figure 9:
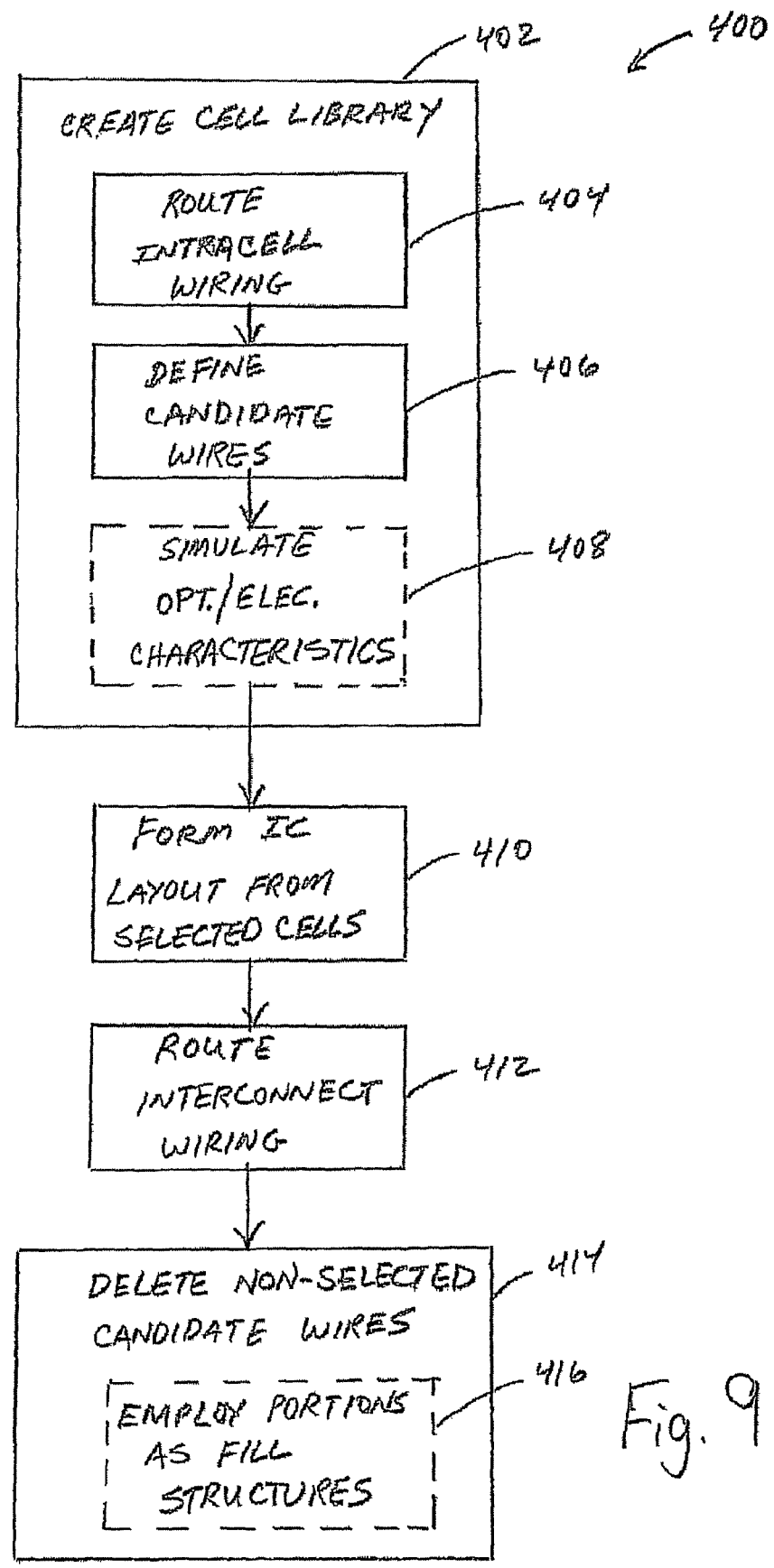
FIG. 9 is a flow diagram illustrating a method of configuring an integrated circuit according to one embodiment.

FIG. 9 is a flow diagram illustrating one embodiment of a process 400 employing candidate intercell wires within library cells for configuring an integrated circuit. Process 400 begins at 402 with configuring a plurality of cells to from a cell library. In one embodiment, the configuring of each cell includes routing or defining intracell wiring in at least one layer positioned above a substrate, the intracell wiring connecting to structures below the at least one layer and forming one or more terminals, as indicated at 404, and defining one or more candidate wires for each terminal to use as intercell wiring to each terminal, as indicated at 406.

In one embodiment, defining candidate wires includes defining one or more candidate up-vias and associated metal extensions from each terminal, such as described above by FIGS. 2 and 3, defining one or more candidate border terminal wires for border terminals, such as described above by FIG. 4, and defining one or more inner terminal wires from inner terminals, such as described above by FIGS. 5 and 6. In one embodiment, defining candidate wire further includes defining route-thru wires in empty spaces within library cells.

In one embodiment, as illustrated by the dashed box at 408, process 400 optionally includes performing a lithography simulation and a simulation of the electrical characteristics of the cell based on the intracell wiring and each of the combinations of candidate wires.

At 410, individual cells are selected form the cell library formed at 402 and arranged to form a desired layout of an IC (e.g. a chip). At 412, routing of intercell wiring is performed by an automated router so as to interconnect the selected cells to achieve a desired function of the integrated circuit including using only selected candidate wires for intercell wiring within borders of each of the selected cells.

At 414, non-selected candidate wires are removed. In one embodiment, as illustrated by the dashed box at 416, removing non-selected wires includes removing only end portions of non-selected candidate inner terminal wires and using a remaining portion of the non-selected candidate inner terminal wires as fill structures.

It will be understood that the methods of forming an integrated circuit as described herein, including predefining candidate vias, candidate border terminal wires, and candidate inner terminal wires, and the selection thereof of during routing processes, such as illustrated by process 400 of FIG. 9, for example, may be implemented in hardware, software, firmware, or any combination thereof. The implementation may be via a microprocessor, programmable logic device, or state machine. Components of the present invention may reside in software on one or more computer-readable mediums. The term computer-readable medium as used herein is defined to include any kind of memory, volatile or non-volatile, such as floppy disks, hard disks, CD-ROMs, flash memory, read-only memory, and random access memory, for example.

It is also noted that, although described above primarily with respect to the M1 layer of logic cell 30, the embodiments described above can be applied to other layers of logic cell 30 as well, including upper metal layers, such as the second metal layer (M2), for example.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of configuring an integrated circuit, the method comprising:
 configuring a plurality of cells to form a cell library, wherein configuring each cell includes:
  defining intracell wiring in at least one layer positioned above a substrate, the intracell wiring connecting to structures below the at least one layer and forming one or more terminals; and
  defining one or more candidate wires for at least one terminal to use as pre-defined intercell wiring for connection to the at least one terminal;
 arranging selected cells from the cell library, via a processor, to form a desired layout of an integrated circuit; and
 routing intercell wiring, via the processor, so as to interconnect the selected cells to achieve a desired function of the integrated circuit including using only selected candidate wires for intercell wiring within borders of each of the selected cells.

2. The method of claim 1, including removing up to all portions non-selected candidate wires.

3. The method of claim 2, including removing only end portions of one or more non-selected candidate wires and employing a remaining portion the one or more non-selected candidate wires as fill structures.

4. The method of claim 1, wherein defining candidate wires includes defining one or more candidate vias and required metal extensions for each terminal.

5. The method of claim 4, wherein candidate vias are positioned based on wiring tracks of upper metal layers.

6. The method of claim 1, wherein defining candidate wires includes defining one or more candidate terminal wires from each terminal to a border connection point along at least one border of the cell.

7. The method of claim 6, wherein defining candidate terminal wires includes defining candidate border terminal wires from each border terminal to a border connection point along at least one border of the cell.

8. The method of claim 6, wherein defining candidate terminal wires includes defining candidate inner terminal wires from each inner terminal to a border connection point along at least one border of the cell.

9. The method of claim 6, wherein ends of candidate terminal wires proximate to a border connection point have a width based on a set of relaxed design rules.

10. The method of claim 6, wherein border connection points along horizontal cell borders are arranged on a grid.

11. The method of claim 6, wherein border connection points along vertical cell borders are arranged on a grid.

12. The method of claim 1, wherein routing intercell wiring includes routing interconnect wires in the at least one layer of a filler cell along a pre-defined grid.

13. The method of claim 11, wherein the pre-defined grid and intercell wiring in the filler cell is based on a set of relaxed design rules.

14. The method of claim 1, wherein the at least one terminal comprises each terminal of the cell.

15. A semiconductor cell for use in a cell library employed for forming an integrated circuit, the cell comprising:
 a plurality of active areas in a substrate, including transistor gates;
 a plurality of intracell wiring in at least one metal layer positioned above the substrate, the intracell wiring connecting to the active areas in the substrate and forming one or more terminals; and
 one or more candidate wires for each terminal to use as pre-defined intercell wiring within borders of the cell in the at least one metal layer for connection to each terminal.

16. The semiconductor cell of claim 15, wherein the candidate wires include one or more candidate vias and associated metal extensions for each terminal.

17. The semiconductor cell of claim 15, wherein the candidate wires include one or more candidate terminal wires from each terminal to a border connection point along at least one border of the cell.

18. The semiconductor cell of claim 17, wherein the candidate terminal wires include candidate border terminal wires and candidate inner terminal wires.

19. The semiconductor cell of claim 17, wherein border connection points along horizontal cell borders of the cell are arranged on a grid.

20. The semiconductor cell of claim 17, wherein border connection points along vertical cell borders of the cell are arranged on a grid.

21. A method of configuring an integrated circuit, the method comprising:
 configuring a plurality of cells to form a cell library, wherein configuring each cell includes:
  defining a plurality of active areas in a substrate, including transistor gates;
  defining intracell wiping in at least one layer positioned above the substrate, the intracell wiring connecting to the active areas and forming one or more terminals; and
  defining one or more candidate wires for at least one terminal to use as pre-defined intercell wiring for connection to the at least one terminal;
 arranging selected cells from the cell library, via a processor, to form a desired layout of an integrated circuit;
 routing intercell wiring, via the processor, so as to interconnect the selected cells to achieve a desired function of the integrated circuit including using only selected candidate wires for intercell wiring within borders of each of the selected cells; and
 removing, via the processor, up to all portions of non-selected candidate wires.

22. The method of claim 21, wherein defining one or more candidate wires is done by hand.

23. The method of claim 21, wherein routing intercell wiring and removing non-selected candidate wires is performed using an automated routing tool.

24. The method of claim 21, including:
 identifying intracell wiring as a first data type; and
 identifying candidate wires as a second data type.

25. A computer-readable medium having computer-executable instructions for configuring an integrated circuit, comprising:
 configuring a plurality of cells to form a cell library, wherein configuring each cell includes:
  defining intracell wiring in at least one layer positioned above a substrate, the intracell wiring connecting to structures below the at least one layer and forming one or more terminals; and defining one or more candidate wires for at least one terminal to use as pre-defined intercell wiring for connection to the at least one terminal;

arranging selected cells from the cell library to form a desired layout of an integrated circuit;

routing intercell wiring so as to interconnect the selected cells to achieve a desired function of the integrated circuit including using only selected candidate wires for intercell wiring within borders of each of the selected cells; and removing up to all portions non-selected candidate wires.

* * * * *